(12) United States Patent
Kim

(10) Patent No.: US 12,041,716 B2
(45) Date of Patent: Jul. 16, 2024

(54) SUBSTRATE

(71) Applicant: LG INNOTEK CO., LTD., Seoul (KR)

(72) Inventor: Nam Heon Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 204 days.

(21) Appl. No.: 17/757,880

(22) PCT Filed: Dec. 18, 2020

(86) PCT No.: PCT/KR2020/018624
§ 371 (c)(1),
(2) Date: Jun. 22, 2022

(87) PCT Pub. No.: WO2021/132991
PCT Pub. Date: Jul. 1, 2021

(65) Prior Publication Data
US 2022/0361318 A1 Nov. 10, 2022

(30) Foreign Application Priority Data

Dec. 23, 2019 (KR) .................. 10-2019-0172832

(51) Int. Cl.
*H05K 1/02* (2006.01)
*H05K 1/03* (2006.01)

(52) U.S. Cl.
CPC .......... *H05K 1/028* (2013.01); *H05K 1/0313* (2013.01); *H05K 2201/0141* (2013.01); *H05K 2201/0158* (2013.01); *H05K 2201/09009* (2013.01)

(58) Field of Classification Search
CPC .................................................. H05K 1/0284
See application file for complete search history.

(56) References Cited

U.S. PATENT DOCUMENTS

2014/0263211 A1 9/2014 Hassan et al.
2016/0353570 A1 12/2016 Lee

FOREIGN PATENT DOCUMENTS

| KR | 1999-0038496 U | 10/1999 |
| KR | 10-2014-0113886 A | 9/2014 |
| KR | 10-2015-0072905 A | 6/2015 |
| KR | 10-2019-0025538 A | 3/2019 |

OTHER PUBLICATIONS

International Search Report dated Apr. 14, 2021 in International Application No. PCT/KR2020/018624.

*Primary Examiner* — Jeremy C Norris
(74) *Attorney, Agent, or Firm* — Saliwanchik, Lloyd & Eisenschenk

(57) ABSTRACT

A substrate according to an embodiment includes an insulating layer having a grain formed therein extending in a first direction; and a circuit pattern disposed on the insulating layer; wherein the insulating layer includes an upper surface and a plurality of outer side surfaces; wherein the plurality of outer side surfaces includes: a first outer side surface extending in the same first direction as the first direction having the grain formed in the insulating layer; and a second outer side surface extending in a second direction different from the first direction and excluding the first outer side surface, wherein the first outer side surface has a first surface roughness; and wherein the second outer side surface has a second surface roughness different from the first surface roughness.

17 Claims, 10 Drawing Sheets

(a)

(b)

SUBSTRATE

CROSS-REFERENCE TO RELATED APPLICATIONS

This application is the U.S. national stage application of International Patent Application No. PCT/KR2020/018624, filed Dec. 18, 2020, which claims the benefit under 35 U. S. C. § 119 of Korean Application No. 10-2019-0172832, filed Dec. 23, 2019, the disclosures of each of which are incorporated herein by reference in their entirety.

TECHNICAL FIELD

The embodiment relates to a substrate, and more particularly, to a substrate having a three-dimensional shape.

BACKGROUND ART

In general, the intelligence of life-related products such as automobiles is accelerating with the spread of mobile devices, and accordingly, the need for an electronic circuit system suitable for the shape of various products is emerging.

In particular, it is necessary to develop printed circuit boards suitable for various product shapes in the implementation of electronic circuit systems suitable for various product groups, but conventionally, the development of a flexible substrate-based printed circuit board (PCB) process technology that can be customized to a three-dimensional object shape that can respond to this has not been developed.

However, the conventional polyimide-based flexible printed circuit board (FPCB) is simply bent and three-dimensionally connected. However, in order to attach to a wearable or three-dimensional (3D) type device for attachment to the human body, a material and an electrode should have the property of being stretchable while being bent, and furthermore, it is necessary to secure the property of being able to freely transform the shape.

In other words, it is essential to develop a multilayer flexible printed circuit board (FPCB) that can support complex information processing capabilities in the development of wearable electronic devices that are spotlighted as a future business. However, a flexible printed circuit board (FPCB) used in a conventional mobile device is a rigid-flex type, in which an existing rigid multi-layer printed circuit board (PCB) and a flexible connection circuit are combined. is the form However, in order to prepare for next-generation wearable devices that require more natural deformation in the future, the development of a high-performance multi-layer flexible printed circuit board (FPCB) that can be deformed even in a three-dimensional shape is urgently required.

DISCLOSURE

Technical Problem

The embodiment provides a substrate capable of manufacturing a three-dimensionally thermoformed substrate using a carrier frame having a directionality, and easily separating the manufactured substrate, and a method of manufacturing the same.

It is to be understood that the technical objectives to be achieved by the embodiments are not limited to the technical matters mentioned above and that other technical subjects not mentioned are apparent to those skilled in the art to which the embodiments proposed from the following description belong.

Technical Solution

A substrate according to the embodiment includes an insulating layer having a grain formed therein extending in a first direction; and a circuit pattern disposed on the insulating layer; wherein the insulating layer includes an upper surface and a plurality of outer side surfaces; wherein the plurality of outer side surfaces includes: a first outer side surface extending in the same first direction as the first direction having the grain formed in the insulating layer; and a second outer side surface extending in a second direction different from the first direction and excluding the first outer side surface, wherein the first outer side surface has a first surface roughness; and wherein the second outer side surface has a second surface roughness different from the first surface roughness.

In addition, the insulating layer includes a polymer having a nematic structure.

In addition, the insulating layer includes LCP (Liquid crystal polymer) or HDPE (High density polyethylene).

In addition, a shape of the grain exposed through the first outer side surface is different from a shape of the grain shape exposed through the second outer side surface.

In addition, the first outer side surface includes: a first portion having the first surface roughness; and a second portion having the second surface roughness.

In addition, a carbon is exposed on at least a part of the second outer side surface.

In addition, the substrate further includes at least one device disposed on the circuit pattern.

In addition, the substrate further includes a protective layer disposed on the insulating layer and covering a surface of the insulating layer and a surface of the circuit pattern;

In addition, the insulating layer includes at least one flat region, and at least one bending region bent from and extending from the flat region.

In addition, the bending region includes a first bending region bent from one end of the flat region; and a second bending region bent from the other end of the flat region, wherein the first bending region and the second bending region have different bending angles.

In addition, the insulating layer includes a first flat region and a second flat region; and the first flat region and the second flat region are positioned on different planes.

On the other hand, a method of manufacturing the substrate according to the embodiment includes preparing a carrier frame having a grain formed therein extending in a first direction; forming a circuit pattern on a substrate region of the carrier frame; forming a protective layer covering the circuit pattern on the substrate region of the carrier frame; forming an anchor by removing at least a portion of an outer region of the substrate region of the carrier frame; thermoforming the carrier frame and the circuit pattern disposed on the substrate region; and separating a substrate comprising the carrier frame and the circuit pattern positioned on the substrate region from the anchor by providing a shear stress to one end of the anchor, wherein the outer region of the substrate region includes a first outer region extending in the same first direction as a direction of the grain; and a second outer region extending in a second direction different from the first direction; and wherein the forming of the anchor includes forming the anchor in the first outer region by laser processing or cutting the second outer region.

In addition, the carrier frame includes a polymer having a nematic structure.

In addition, the carrier frame includes LCP (Liquid crystal polymer) or HDPE (High density polyethylene).

In addition, an outer side surface of the carrier frame constituting the separated substrate includes a first outer side surface extending in the same first direction as the direction of the grain and corresponding to the first outer region; and a second outer side surface extending in a second direction different from the first direction and corresponding to the second outer region; wherein the first outer side surface has a first surface roughness; and the second outer side surface has a second surface roughness different from the first surface roughness.

In addition, a shape of the grain exposed through the first outer side surface is different from the grain shape exposed through the second outer side surface.

In addition, the first outer side surface includes a first portion having the first surface roughness; and a second portion having the second surface roughness.

In addition, the method of manufacturing the substrate further includes attaching at least one device on the circuit pattern, and the protective layer is disposed to cover the device.

Advantageous Effects

According to an embodiment, a substrate is manufactured using a carrier frame with one constant directionality in an entire region, and the carrier frame is laser machined to form an anchor around the substrate. In this case, the anchor may be formed to separate only the region in which the manufactured substrate is formed on the carrier frame. At this time, a side surface of the anchor is in contact with an outer side surface of the substrate. Then, when a 3D molding process of the substrate is completed, an interface between the anchor and the outer side surface of the substrate is cut to separate the substrate.

Here, in the present embodiment, the side surface of the anchor connected to the outer side surface of the substrate extends in a first direction. In this case, the first direction corresponding to the extension direction of the side surface of the anchor may correspond to the directionality of the carrier frame. That is, the carrier frame is a polymer having a nematic structure in which molecules are arranged in a certain specific direction, and accordingly, a grain is formed in the carrier frame to correspond to the direction in which the molecules are arranged. Accordingly, when forming the anchor, the remaining portions of the outer side surface of the substrate except for a portion having the same extension direction as the direction of the carrier frame are laser processed, and accordingly, the anchor is formed only on the outer side surface of the substrate having the same extension direction as the direction of the carrier frame. Accordingly, in an embodiment, the substrate may be easily separated by providing a shear stress to the interface without performing an alignment process for separating the substrate or an additional laser or cutting process.

In addition, in an embodiment, module products can be separated using the anchor after forming a plurality of module products requiring three-dimensional molding on a carrier frame, and accordingly, it is suitable for mass production of 3D molding, and molding difficulty may be reduced by reducing residual stress that may be generated due to the carrier frame.

DESCRIPTION OF DRAWINGS

FIG. 4 is a plan view of the substrate when a grain direction of the carrier frame (insulating layer) of FIG. 3 is a longitudinal direction.

FIG. 5 is a plan view of the substrate when a grain direction of the carrier frame (insulating layer) of FIG. 3 is in a horizontal direction.

MODES OF THE INVENTION

Figure 1:
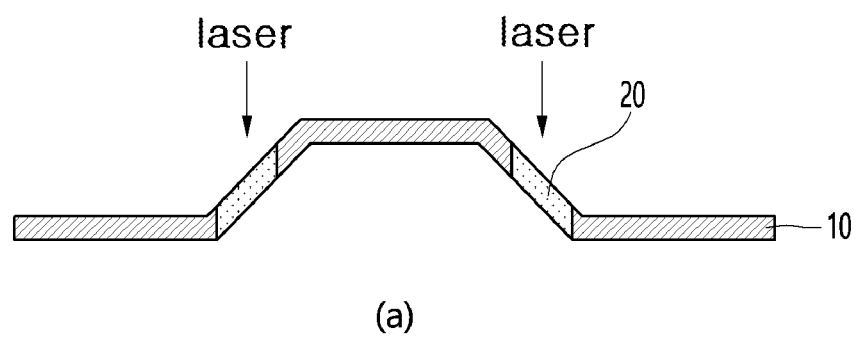
FIGS. 1 and 2 are views for explaining a manufacturing process of a substrate having a three-dimensional shape according to a comparative example.
Figure 1:
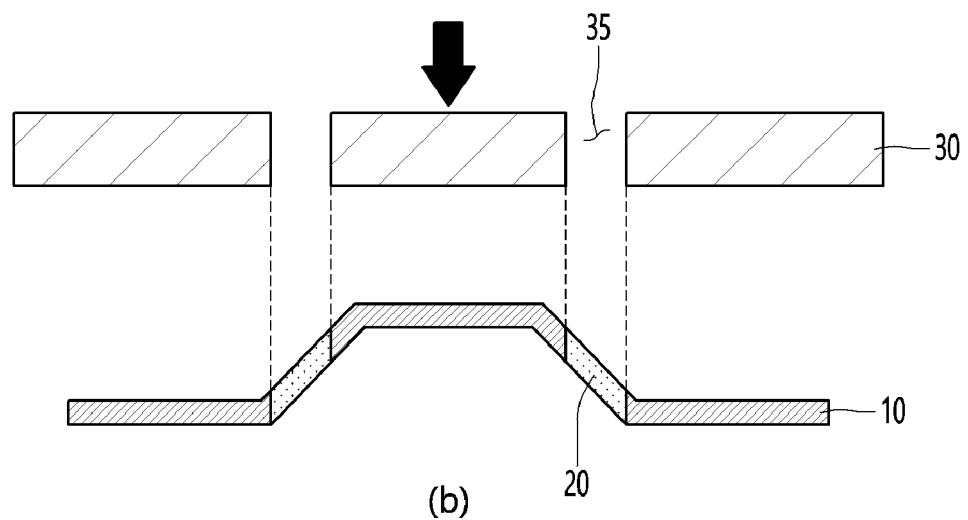

Hereinafter, the embodiment disclosed in the present specification will be described in detail with reference to the accompanying drawings, but the same or similar components are designated by the same reference numerals regardless of drawing numbers, and repeated description thereof will be omitted. The component suffixes "module" and "part" used in the following description are given or mixed together only considering the ease of creating the specification, and have no meanings or roles that are distinguished from each other by themselves. In addition, in describing the embodiments disclosed in the present specification, when it is determined that detailed descriptions of a related well-known art unnecessarily obscure gist of the embodiments disclosed in the present specification, the detailed description thereof will be omitted. Further, the accompanying drawings are merely for facilitating understanding of the embodiments disclosed in the present specification, the technological scope disclosed in the present specification is not limited by the accompanying drawings, and it should be understood as including all modifications, equivalents and alternatives that fall within the spirit and scope of the present invention.

It will be understood that, although the terms "first," "second," etc. may be used herein to describe various elements, these elements should not be limited by these terms. These terms are only used to distinguish one element from another.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The singular expression includes the plural expression unless the context clearly dictates otherwise.

It will be further understood that the terms "includes," or "have," when used herein, specify the presence of stated features, integers, steps, operations, elements, and/or components, but do not preclude the presence or addition of one or more other features, integers, steps, operations, elements, components, and/or groups thereof.

Hereinafter, embodiments of the present disclosure will be described in detail with reference to the accompanying drawings.

Figure 2:
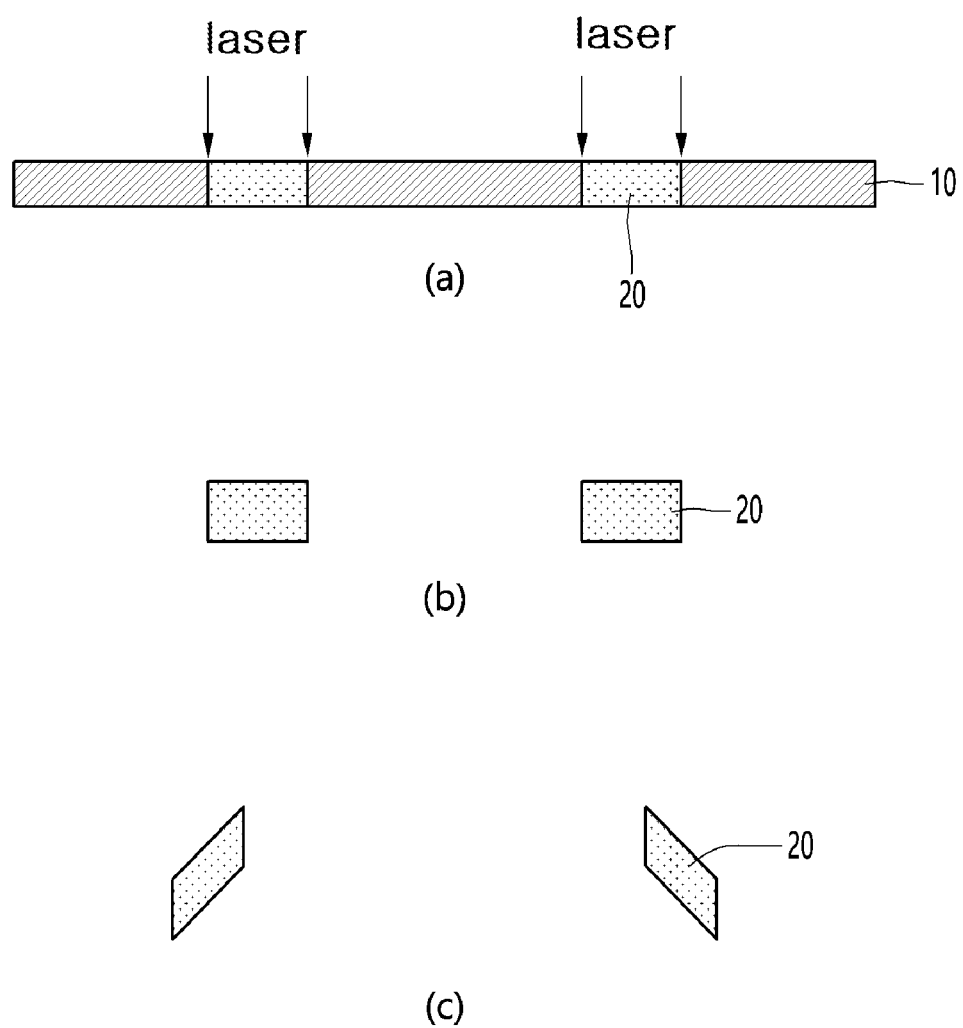

FIGS. 1 and 2 are views for explaining a manufacturing process of a substrate having a three-dimensional shape according to a comparative example.

Referring to (a) and (b) of FIG. 1, the substrate in the comparative example includes a first region 10 and a second region 20.

The second region 20 of the substrate is an actual product region, and the first region 10 is a region other than the actual product region.

Accordingly, in the comparative example, a process of separately separating only the second region 20 by removing the first region 10 from an entire region of the substrate is required.

Briefly describing the manufacturing process of the substrate of the comparative example, a carrier frame is prepared, and a substrate including the first region 10 and the second region 20 is formed through the process of forming a circuit pattern, attaching an electronic device and forming a protective layer on the prepared carrier frame. Then, when the substrate is formed, a thermoforming process of the second region 20 is performed to manufacture a shape of the second region 20 corresponding to an actual product into a desired three-dimensional shape.

Then, when the three-dimensional shape substrate is manufactured, a process of separating the second region 20 from the three-dimensional shape substrate is performed. In this case, cutting points for separating the second region 20 are not all arranged on the same plane in the three-dimensional shape substrate manufactured through thermoforming. Accordingly, a technique capable of separating the second region 20 by cutting at various heights is required in the comparative example. In addition, a movement of the substrate may occur during the cutting process as described above, and accordingly, a precise alignment technique capable of accurately finding the interface between the first region 10 and the second region 20 is required.

At this time, as in (a) of FIG. 1, the cutting process in Comparative Example 1 is performed using a laser. However, as described above, all of the cutting points are not positioned on the same plane, and thus, there is a problem in that the laser has to be focused according to a height of each cutting point during the laser process.

In addition, as in the second comparative example of (b) of FIG. 2, the second region 20 may be separated using a jig having a blade rather than a laser. In this case, when the jig is used, it is possible to solve the problem according to the height, which was a problem in the first comparative example. However, a jig equipped with a small blade having a size of 200 μm or less is required in order to separate only the second region 20 on the substrate as described above, and an error range of alignment precision must be ±50 μm or less, and accordingly, there is a problem in that productivity decreases.

On the other hand, referring to (a) and (b) of FIG. 2, as in the third comparative example, the laser process is preferentially performed before the thermoforming process is performed, and whereby the second region 20 may be separated in a state where all of the cutting points lie on the same plane. And, in the third comparative example, when the second region 20 is separated, a separate thermoforming process is performed only for the second region 20 as shown in (c) of FIG. 2. In this case, a plurality of second regions 20 may be provided on the substrate. In other words, when one second region 20 is referred to as one sample, a plurality of different samples are generally simultaneously produced on one carrier frame. However, when the cutting process is first performed before thermoforming as described above, an additional process for holding a plurality of samples is required during the cutting process, and there is a problem in that mobility between the processes of the plurality of samples is decreased. In addition, when the thermoforming process is performed in a state in which only the second region 20 is separated, a size of the separated second region 20 is very small, and accordingly, it is difficult to thermoform the second region 20 into a desired three-dimensional shape.

Accordingly, the embodiment provides a substrate and a method for manufacturing the same, which can simplify the manufacturing process and reduce manufacturing costs without causing a problem in the manufacturing process of the substrate having a three-dimensional shape.

Figure 3:
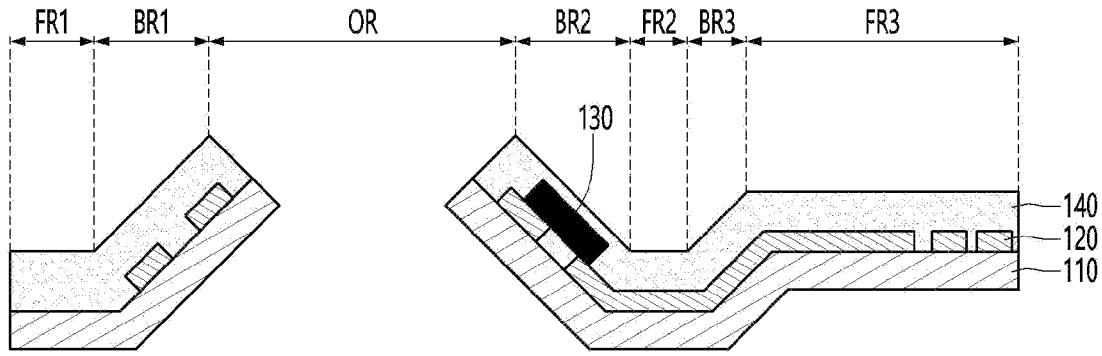
FIG. 3 is a cross-sectional view showing a substrate according to a first embodiment.
Figure 4:
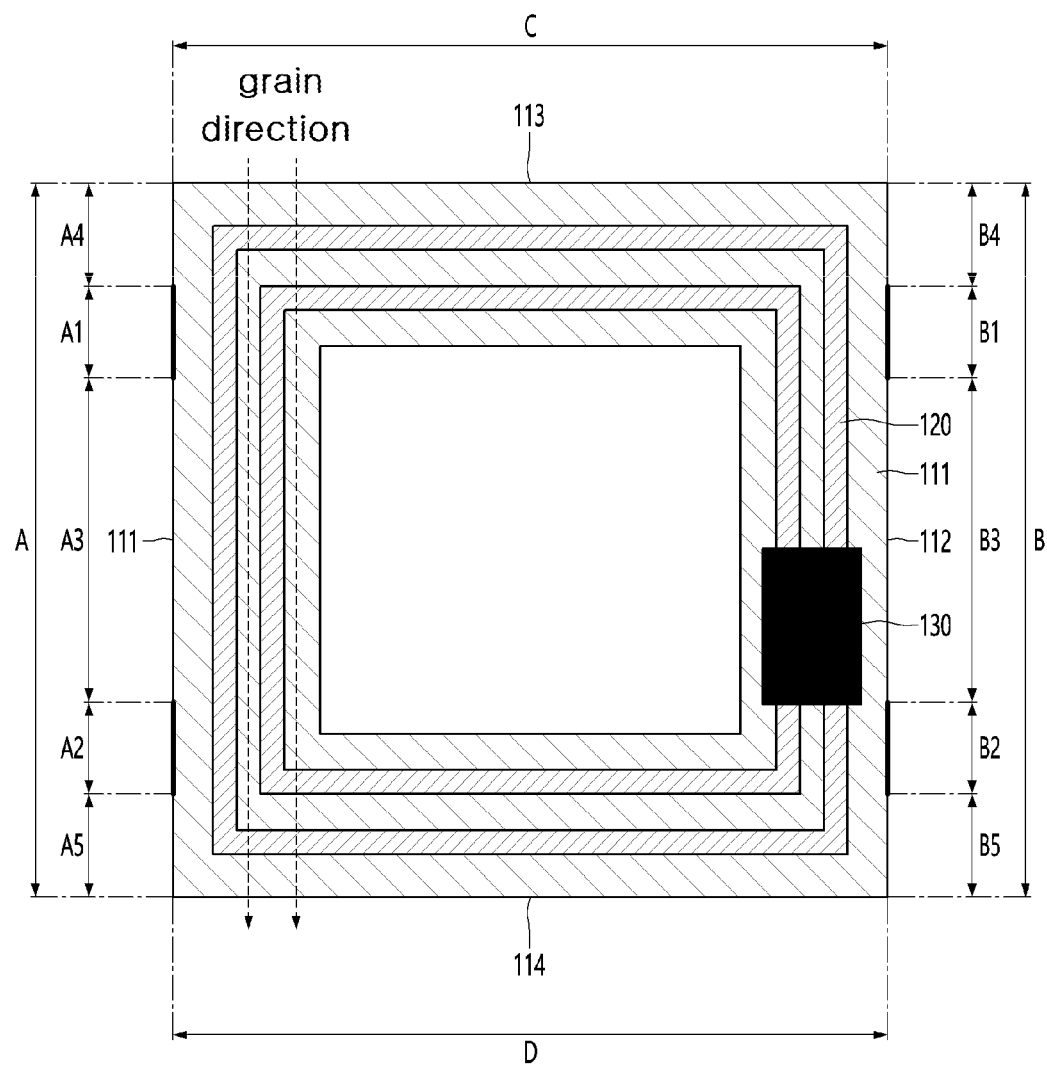
FIGS. 4 and 5 are plan views of the substrate shown in FIG. 3.
Figure 5:
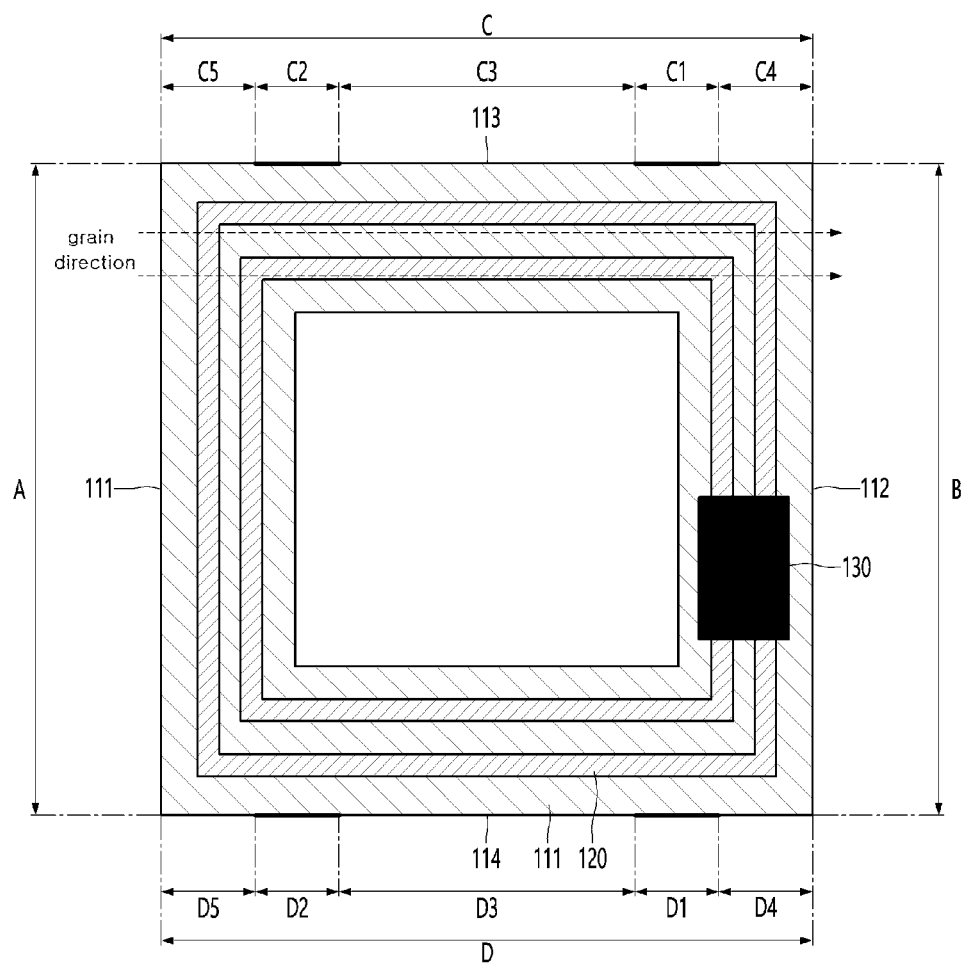

FIG. 3 is a cross-sectional view showing a substrate according to a first embodiment, and FIGS. 4 and 5 are plan views of the substrate shown in FIG. 3. FIG. 4 is a plan view of the substrate when a grain direction of the carrier frame (insulating layer) of FIG. 3 is a longitudinal direction, and FIG. 5 is a plan view of the substrate when a grain direction of the carrier frame (insulating layer) of FIG. 3 is in a horizontal direction.

Referring to FIG. 3, the substrate 100 includes an insulating layer 110, a circuit pattern 120 disposed on the insulating layer 110, a device 130 disposed on the circuit pattern 120, and a protective layer 140 disposed on the insulating layer 110 to cover the circuit pattern 120 and the device 130.

The insulating layer 110 may be a basic material used for manufacturing a substrate. Preferably, the insulating layer 110 may be a part of a carrier frame used to manufacture the substrate. That is, the carrier frame (to be described later) may include a first region corresponding to the insulating layer 110 of the substrate 100 and a second region excluding the first region. In addition, in a state in which the circuit pattern 120, the device 130, and the protective layer 140 are sequentially disposed on the carrier frame, a shearing process for separating the first region may be performed to manufacture the substrate.

A grain may be formed in the insulating layer 110. Preferably, the insulating layer 110 may have a nematic structure. The nematic structure may mean a state in which all molecules have identical and constant directionality. Accordingly, the grain may be formed in the insulating layer 110 to correspond to the directionality of the molecules due to the nematic structure.

Preferably, the insulating layer 110 may be a polymer belonging to the category of P-hydroxy benzoic acid (benzoic acid with OH in the para-position) and monomer-based crystalline aromatic polyesters based on p-hydroxybenzoic acid and related monomers.

Preferably, the insulating layer 110 may include a polymer material such as vectron (a product obtained by melt spinning vectra) or Kevlar.

For example, the insulating layer 110 may be an anisotropic film of at least one of LCP (liquid crystal polymer) and HDPE (high density polyethylene), but is not limited thereto. In other words, as the insulating layer 110 has a nematic structure, it may be any one of various films including a polymer material in which molecules are arranged with one and the same directionality.

Accordingly, the insulating layer 110 may have a property of being cut along the grain by shear stress applied in the direction of the grain.

A circuit pattern 120 is disposed on the insulating layer 110. The circuit pattern 120 may be disposed on the insulating layer 110 to transmit an electrical signal. However, the embodiment is not limited thereto, and a layer corresponding to the circuit pattern 120 may be formed on the insulating layer 110, which may perform a heat dissipation function or a signal shielding function rather than an electrical signal transmission function.

The circuit pattern 120 may be formed of a metal material having high electrical conductivity. To this end, the circuit pattern 120 may be formed of at least one metal material selected from gold (Au), silver (Ag), platinum (Pt), titanium (Ti), tin (Sn), copper (Cu), and zinc (Zn). In addition, the circuit pattern 120 may be formed of a paste or solder paste including at least one metal material selected from gold (Au), silver (Ag), platinum (Pt), titanium (Ti), tin (Sn), copper (Cu), and zinc (Zn). Preferably, the circuit pattern 120 may be formed of copper (Cu), which has high electrical conductivity and is relatively inexpensive.

The circuit pattern 120 may be formed using an additive process, a subtractive process, a modified semi additive process (MSAP), and a semi additive process (SAP), which are typical printed circuit board manufacturing processes, and a detailed description will be omitted here.

A device 130 may be attached on the circuit pattern 120. The device 130 may be determined according to an application to which the substrate 100 is applied.

The device 130 may be a passive device. For example, the device 130 may be a passive device such as a wiring, a resistor, and a chip. The device 130 may be an active device. For example, the device 130 may be an active device such as a multiplexer, an application specific integrated circuit (ASIC), or a wireless communication module. In addition to this, the device 130 may include an optical device such as a lens or a waveguide, a magnetic device, and an electrochemical device such as a battery or an enzyme sensor.

A protective layer 140 is disposed on the insulating layer 110.

The protective layer 140 may be disposed on the insulating layer 110 to protect a exposed surface of the insulating layer 110, the circuit pattern 120, and the device 130. Accordingly, the protective layer 140 may have a height greater than that of the device 130, and thus the circuit pattern 120 and the device 130 may be embedded in the protective layer 140, but is not limited thereto.

To this end, the protective layer 140 may include an epoxy acrylate-based resin. For example, the protective layer 140 may include a resin, a curing agent, a photo initiator, a pigment, a solvent, a filler, an additive, an acryl-based monomer, and the like. However, the embodiment is not limited thereto, the protective layer 140 may be any one of a solder-resist (SR), a cover-lay, and a polymer material.

Meanwhile, the substrate 100 has a three-dimensional shape. For example, the substrate 100 may include a flat region provided flat and a bending region extending from the flat region and bent to a specific curvature. For example, the substrate 100 may include a plurality of flat regions, and the plurality of flat regions may be positioned on different planes. For example, the heights of the plurality of flat regions included in the substrate 100 may be different from each other. Also, the substrate 100 may include a plurality of bending regions, and curvatures or bending angles of the plurality of bending regions may be different from each other.

As shown in FIG. 3, the substrate 100 may include a first flat region FR1, a second flat region FR2, a third flat region FR3, a first bending region BR1, a second bending region BR2, a third bending region BR3, and an upper surface. In this case, the first flat region FR1, the second flat region FR2, the third flat region FR3, the first bending region BR1, the second bending region BR2 and the upper surface included in the substrate 100 is described based on the protective layer 140 of the substrate 100. However, when the insulating layer 110 of the substrate 100 is used as a reference, the position of each region may be changed differently from that shown in FIG. 3.

Each of the first flat region FR1, the second flat region FR2, and the third flat region FR3 may have the same height as one end and the other end facing the one end. That is, the first flat region FR1, the second flat region FR2, and the third flat region FR3 may have a planar shape.

The first flat region FR1, the second flat region FR2, and the third flat region FR3 may be disposed on different planes. For example, the first flat region FR1 and the second flat region FR2 may be disposed on the same plane. For example, upper surfaces of the first flat region FR1 and the second flat region FR2 may be disposed on the same plane. For example, the first flat region FR1 and the third flat region FR3 may be disposed on different planes. For example, an upper surface of the first flat region FR1 and an upper surface of the third flat region FR3 may be positioned on different planes. For example, an upper surface of the first flat region FR1 may be positioned lower than an upper surface of the second flat region FR2. For example, the second flat region FR2 and the third flat region FR3 may be disposed on different planes. For example, an upper surface of the second flat region FR2 and an upper surface of the third flat region FR3 may be positioned on different planes. For example, an upper surface of the second flat region FR2 may be positioned lower than an upper surface of the third flat region FR3. However, the embodiment is not limited thereto, and a number of the flat regions may be changed according to an application to which the substrate 100 is applied, and the position of the upper surface of each flat region may also be changed.

Meanwhile, the bending region may be positioned between a plurality of flat regions in the substrate 100. The bending region may allow the substrate 100 to have a three-dimensional shape.

The first bending region BR1 may extend from one end of the first flat region FR1. The first bending region BR1 may be bent with a predetermined curvature or angle. For example, heights of one end and the other end of the first bending region BR1 may be different. For example, a height of one end of the first bending region BR1 may be lower than a height of the other end.

The second bending region BR2 may extend from one end of the second flat region FR2. For example, the second bending region BR2 may extend inwardly from one end of the second flat region FR2. The second bending region BR2 may be bent with a predetermined curvature or an angle from one end of the second flat region FR2. For example, heights of one end and the other end of the second bending region BR2 may be different. For example, a height of one end of the second bending region BR2 may be higher than a height of the other end of the second bending region BR2.

The third bending region BR3 may extend from the other end of the second flat region FR2. Also, the third bending region BR3 may extend from one end of the third flat region FR3. Preferably, the third bending region BR3 may be disposed between the other end of the second flat region FR2 and one end of the third flat region FR3. The third bending region BR3 may be bent with a predetermined curvature or an angle from the other end of the second flat region FR2 and the one end of the third flat region FR3. For example, heights of one end and the other end of the third bending region BR3 may be different. For example, a height of one end of the third bending region BR3 may be lower than a height of the other end.

Meanwhile, an open region OR may be formed between the first bending region BR1 and the second bending region BR2. The open region OR may be a through hole passing through the upper and lower surfaces of the substrate 100. For example, the protective layer 140, the circuit pattern 120, and the insulating layer 110 may not be disposed on the open region OR. For example, a planar shape of the substrate 100 may have a rectangular shape in which an opening such as the open region OR is formed in a center.

Meanwhile, the substrate 100 may include an outer side surface. The outer side surface means a side surface positioned outside the substrate 100, and may include, for example, the outer side surface of the insulating layer 110 of the substrate 100 and the outer side surface of the protective layer 140. In this case, an entire region of the outer side surface of the protective layer 140 may have a uniform surface roughness.

Meanwhile, the outer side surface of the insulating layer 110 may include a region having a first surface roughness and a region having a second surface roughness having a second roughness different from the first roughness, based on a grain direction of the insulating layer 110.

For example, the insulating layer 110 may include a plurality of outer side surfaces divided with respect to an edge portion of the substrate 100 to correspond to a shape of the substrate 100.

For example, as shown in FIG. 4, the insulating layer 110 includes a first outer side surface 111 positioned on a left side with respect to the upper surface, a second outer side surface 112 positioned on a right side, a third outer side surface 113 positioned on an upper side, and a fourth outer side surface 114 positioned on a lower side.

In this case, the plurality of outer side surfaces constituting the insulating layer 110 may extend in different directions, respectively. For example, the first outer side surface 111 may extend in a first direction. For example, the first outer side surface 111 may extend in a longitudinal direction. The second outer side surface 112 may extend in the same first direction as the first outer side surface 111. For example, the second outer side surface 112 may extend in the same longitudinal direction as the first outer side surface 111. The third outer side surface 113 may extend in a second direction different from the first outer side surface 111 and the second outer side surface 112. For example, the third outer side surface 113 may extend in a second direction substantially perpendicular to the first direction. For example, the third outer side surface 113 may extend in a horizontal direction. The fourth outer side surface 114 may extend in the same second direction as the third outer side surface 113. For example, the fourth outer side surface 114 may extend in a horizontal direction.

That is, the insulating layer 110 may include the first outer side surface 111 and the second outer side surface 112 disposed to face each other and extending in the first or longitudinal direction. In addition, the insulating layer 110 may include the third outer side surface 113 and the fourth outer side surface 114 disposed to face each other between the first outer side surface 111 and the second outer side surface 112 and extending in a second direction perpendicular to the first direction or a horizontal direction.

In this case, at least one part of the outer side surface corresponding to the grain direction of the insulating layer 110 among the plurality of outer side surfaces may have a different surface roughness from the other portions except for this.

In other words, the outer side surface of the insulating layer 110 may be formed by different processes for each region, and accordingly, the outer side surface of the insulating layer 110 may have a surface roughness corresponding to the performed process.

Preferably, a portion of the outer side surface of the insulating layer 110 may be formed by cutting through laser processing, and the remaining portion may be formed by cutting through shear stress. At this time, it has been said that a portion of the outer side surface of the insulating layer 110 is cut by laser processing, but this is only an example, and a portion of the outer side surface may be cut by a cutting stage other than a laser. Hereinafter, it will be described that a part of the outer side surface is processed by a laser.

Accordingly, the portion formed by the laser processing may have a first surface roughness. In addition, the portion cut-formed by the shear stress may have a second surface roughness different from the first surface roughness.

In other words, the portion formed by the laser processing may be formed by burning with the laser. Accordingly, a carbon may be exposed on the outer side surface formed by the laser. In addition, the outer side surface formed by the laser may have a first surface roughness corresponding to a laser condition.

In addition, the portion formed by the shear stress is a portion in which torn or breakage occurs due to the shear stress applied by a jig. For example, the portion formed by the shear stress is a portion in which torn or break occurs in the grain as the shear stress is applied in the grain direction of the insulating layer 110. Accordingly, the portion formed by the shear stress may have a second surface roughness different from the portion formed by the laser. In addition, the portion formed by the shear stress may not have carbon remaining on the surface, unlike the portion formed by the laser. Also, the grain of the insulating layer 110 in the portion formed by the shear stress may be exposed differently from the portion formed by the laser. That is, damage is applied to the grain of the insulating layer 110 in the portion formed by the laser, and accordingly, the grain of the insulating layer 110 is not exposed or it is impossible to check the grain direction. However, the portion formed by the shear stress is a portion torn by applying a shear stress in the grain direction, and the grain of the insulating layer 110 may be exposed in this portion, and accordingly, the grain direction of the insulating layer 110 can be confirmed.

In this case, the portion formed by the laser and the portion formed by the shear stress may be determined by a grain direction of the insulating layer 110.

For example, the portion formed by the laser may be an outer side surface extending in a direction different from a grain direction of the insulating layer 110.

As shown in FIG. 4, the grain is formed in the insulating layer 110 in a first direction or a longitudinal direction. In addition, the first outer side surface 111 and the second outer side surface 112 of the insulating layer 110 extend in the same first direction as the grain direction of the insulating layer 110. In addition, the third outer side surface 113 and the fourth outer side surface 114 of the insulating layer 110 extend in a second direction different from the grain direction of the insulating layer 110.

Accordingly, the third outer side surface 113 and the fourth outer side surface 114 may be portions formed by the laser processing. Accordingly, an entire region C of the third outer side surface 113 may be formed by a laser, and thus may have a first surface roughness. Likewise, an entire region D of the fourth outer side surface 114 may be formed by a laser, and thus may have a first surface roughness corresponding to the third outer side surface 113.

Meanwhile, the first outer side surface 111 and the second outer side surface 112 extend in the same first direction as the grain direction of the insulating layer 110. Accordingly, the first outer side surface 111 and the second outer side surface 112 may be formed by shear stress applied through the jig.

Accordingly, the first outer side surface 111 may have a different surface roughness from the third outer side surface 113 and the fourth outer side surface 114. For example, the first outer side surface 111 and the second outer side surface 112 may have a second surface smaller than the first surface roughness of the third outer side surface 113 and the fourth outer side surface 114.

In this case, in the first embodiment, an entire region A of the first outer side surface 111 may have the second surface roughness. In addition, an entire region B of the second outer side surface 112 may have the second surface roughness. In other words, in the first embodiment, the entire region A of the first outer side surface 111 may be formed by cutting the insulating layer 110 in the grain direction through shear stress applied by a jig. Likewise, the entire region B of the second outer side surface 112 may be formed by cutting the insulating layer 110 in the grain direction through shear stress applied by a jig.

However, when the region in which the insulating layer 110 is cut in the grain direction due to the shear stress becomes large, the process time increases, and damage may be applied to other portions of the substrate 100 in the process of cutting in the grain direction. Therefore, in the second embodiment, only a portion A1 and A2 of the entire region A of the first outer side surface 111 is to be formed through shear stress applied by a jig based on a size of the first outer side surface 111, and the remaining portions A3, A4 and A5 other than this are formed by laser processing. In addition, only a portion B1, B2 of the entire region B of the second outer side surface 112 is to be formed through the shear stress applied by the jig based on a size of the second outer side surface 112, and the remaining portions B3, B4 and B5 other than this are formed by laser processing.

For example, one portion A1 and A2 of the first outer side surface 111 and one portion B1 and B2 of the second outer side surface 112 allow the substrate 100 to be fixed on the carrier frame in the thermoforming process of the substrate 100. Accordingly, one portion A1 and A2 of the first outer side surface 111 and one portion B1 and B2 of the second outer side surface 112 may be determined based on a size capable of fixing the substrate 100 on the carrier frame.

Accordingly, the first outer side surface 111 in the embodiment may include a first portion A1 and a second portion A2 that is a region torn by shear stress applied by the jig and have a second surface roughness. In addition, the first outer side surface 111 may include a third portion A3, a fourth portion A4, and a fifth portion A5 that is a region cut by a laser and have a first surface roughness different from the second surface roughness.

In addition, the second outer side surface 112 in the embodiment may include a first portion B1 and a second portion B2 that is a region torn by shear stress applied by the jig and have a second surface roughness. In addition, the second outer side surface 112 may include a third portion B3, a fourth portion B4, and a fifth portion B5 that is a region cut by a laser and have a first surface roughness different from the second surface roughness.

Meanwhile, the entire region C of the third outer side surface 113, the entire region D of the fourth outer side surface 114, and third to fifth portions A3, A4 and A5 of the first outer side surface 111, and the third to fifth portions B3, B4, and B5 of the second outer side surface 112 are formed before thermoforming of the substrate 100, that is, in a state in which the entire region of the substrate 100 is flat. In addition, the first and second portions A1 and A2 of the first outer side surface 111 and the first and second portions B1 and B2 of the second outer side surface 112 are formed after thermoforming of the substrate 100, that is, in a state in which the substrate 100 has a three-dimensional shape.

Figure 6:
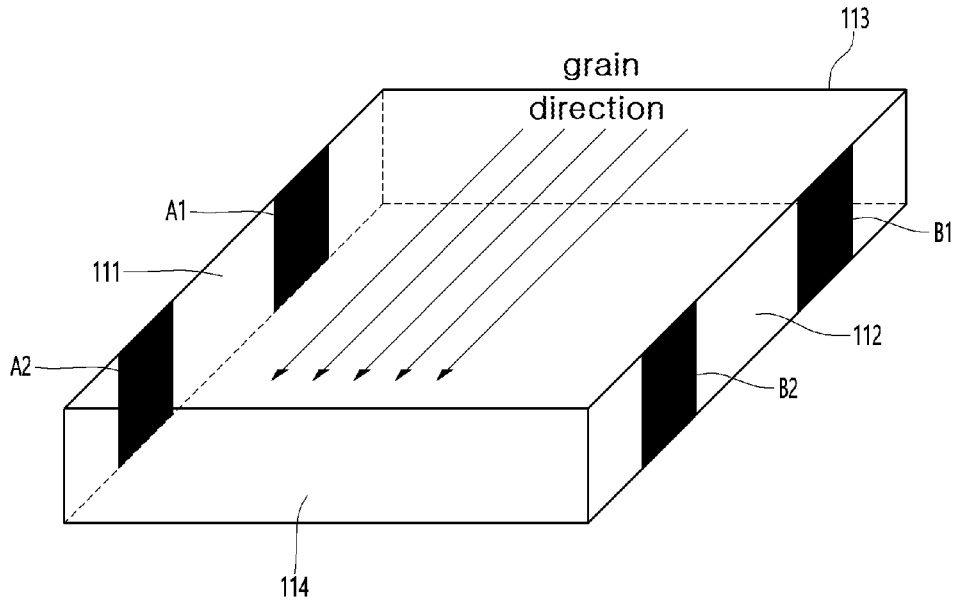
FIG. 6 is a perspective view of the insulating layer shown in FIG. 4.

FIG. 6 is a perspective view of the insulating layer shown in FIG. 4.

As shown in FIG. 6, in the embodiment, the remaining portions A3, A4, A5, B3, B4, B5, C and D excluding at least one portion A1, A2, B1 and B2 of the outer side surface extending in the same direction as the grain direction is cut by laser processing based on the grain direction of the insulating layer 110 before the thermoforming process. And, at least a portion of the outer side surface extending in the same direction as the grain direction that is not removed by the laser is cut by applying a shear stress in the grain direction after the thermoforming process.

Meanwhile, in another embodiment, unlike FIG. 4, the grain of the insulating layer 110 may be in a second direction instead of in the first direction as shown in FIG. 5.

In this case, the third outer side surface 113 and the fourth outer side surface 114 of the insulating layer 110 extend in the same second direction as the grain direction of the insulating layer 110. In addition, the first outer side surface 111 and the fourth outer side surface 112 of the insulating layer 110 extend in a second direction different from the grain direction of the insulating layer 110.

Accordingly, the first outer side surface 111 and the second outer side surface 112 may be formed by the laser processing. Accordingly, the entire region A of the first outer side surface 111 may be formed by a laser, and thus may have a first surface roughness. Likewise, the entire region B of the second outer side surface 112 may be formed by a laser, and thus may have a first surface roughness corresponding to the first outer side surface 111.

Meanwhile, the third outer side surface 113 and the fourth outer side surface 114 extend in the same second direction as the grain direction of the insulating layer 110. Accordingly, the third outer side surface 113 and the fourth outer side surface 114 may be formed by shear stress applied through the jig.

However, as described with reference to FIG. 4, the entire region of the third outer side surface 113 and the fourth outer side surface 114 may be formed by shear stress, and alternatively, only a portion may be formed by shear stress.

For example, one portion C1 and C2 of the third outer side surface 113 and one portion D1 and D2 of the fourth outer side surface 114 allow the substrate 100 to be fixed on the carrier frame in the thermoforming process of the substrate 100. Accordingly, one portion C1 and C2 of the third outer side surface 113 and one portion D1 and D2 of the fourth outer side surface 114 may be determined based on a size capable of fixing the substrate 100 on the carrier frame.

Accordingly, the third outer side surface 113 in the embodiment may include a first portion C1 and a second portion C2 that is a region torn by shear stress applied by the jig and have a second surface roughness. In addition, the third outer side surface 113 may include a third portion C3, a fourth portion C4, and a fifth portion C5 that is a region cut by a laser and have a first surface roughness different from the second surface roughness.

In addition, the fourth outer side surface 114 in the embodiment may include a first portion D1 and a second portion D2 that is a region torn by shear stress applied by the jig and have a second surface roughness. In addition, the fourth outer side surface 114 may include a third portion D3, a fourth portion D4, and a fifth portion D5 that is a region cut by a laser and have a first surface roughness different from the second surface roughness.

Meanwhile, the entire region A of the first outer side surface 111, the entire region B of the second outer side surface 112, and third to fifth portions C3, C4 and C5 of the third outer side surface 113, and the third to fifth portions D3, D4, and D5 of the fourth outer side surface 114 are formed before thermoforming of the substrate 100, that is, in a state in which the entire region of the substrate 100 is flat. In addition, the first and second portions C1 and C2 of the third outer side surface 113 and the first and second portions D1 and D2 of the fourth outer side surface 114 are formed after thermoforming of the substrate 100, that is, in a state in which the substrate 100 has a three-dimensional shape.

As described above, the remaining portion except for at least one portion of the outer side surface extending in the same direction as the grain direction of the embodiment is cut by laser processing based on the grain direction of the insulating layer 110 before the thermoforming process. And, at least a portion of the outer side surface extending in the same direction as the grain direction of the embodiment that is not removed by the laser is cut by applying a shear stress in the grain direction after the thermoforming process.

According to an embodiment, a substrate is manufactured using a carrier frame with one constant directionality in an entire region, and the carrier frame is laser machined to form an anchor around the substrate. In this case, the anchor may be formed to separate only the region in which the manufactured substrate is formed on the carrier frame. At this time, a side surface of the anchor is in contact with an outer side surface of the substrate. Then, when a 3D molding process of the substrate is completed, an interface between the anchor and the outer side surface of the substrate is cut to separate the substrate.

Here, in the present embodiment, the side surface of the anchor connected to the outer side surface of the substrate extends in a first direction. In this case, the first direction corresponding to the extension direction of the side surface of the anchor may correspond to the directionality of the carrier frame. That is, the carrier frame is a polymer having a nematic structure in which molecules are arranged in a certain specific direction, and accordingly, a grain is formed in the carrier frame to correspond to the direction in which the molecules are arranged. Accordingly, when forming the anchor, the remaining portions of the outer side surface of the substrate except for a portion having the same extension direction as the direction of the carrier frame are laser processed, and accordingly, the anchor is formed only on the outer side surface of the substrate having the same extension direction as the direction of the carrier frame. Accordingly, in an embodiment, the substrate may be easily separated by providing a shear stress to the interface without performing an alignment process for separating the substrate or an additional laser or cutting process.

In addition, in an embodiment, module products can be separated using the anchor after forming a plurality of module products requiring three-dimensional molding on a carrier frame, and accordingly, it is suitable for mass production of 3D molding, and molding difficulty may be reduced by reducing residual stress that may be generated due to the carrier frame.

Meanwhile, various modifications of the substrate according to the embodiment will be described below.

Figure 7:
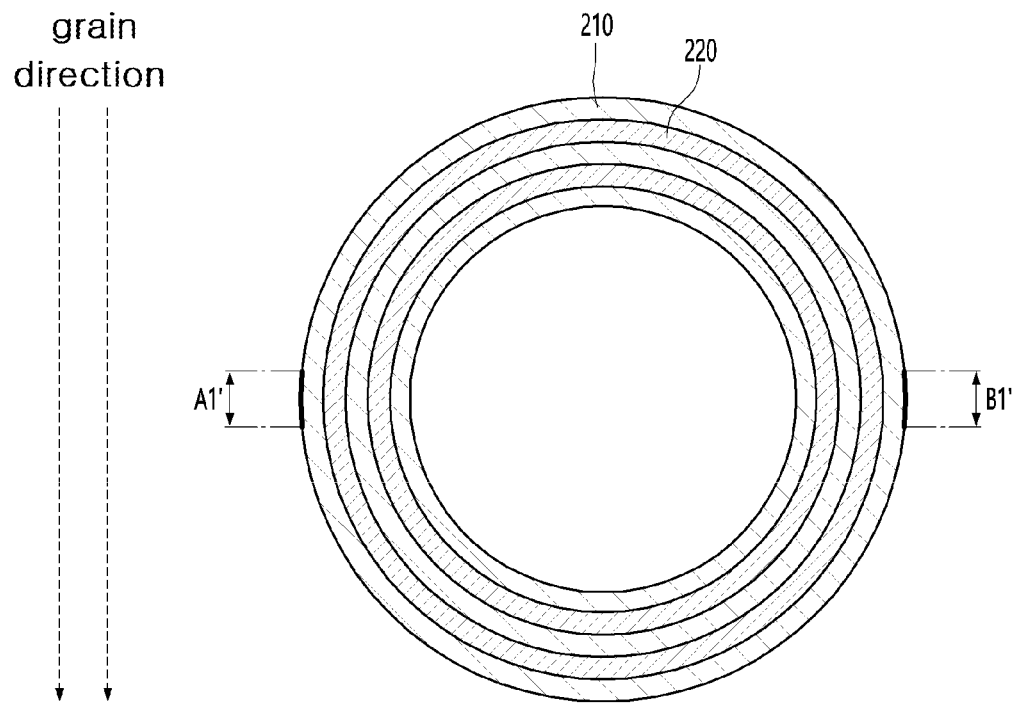
FIG. 7 is a plan view showing a first modified example of the substrate shown in FIG. 4.
Figure 8:
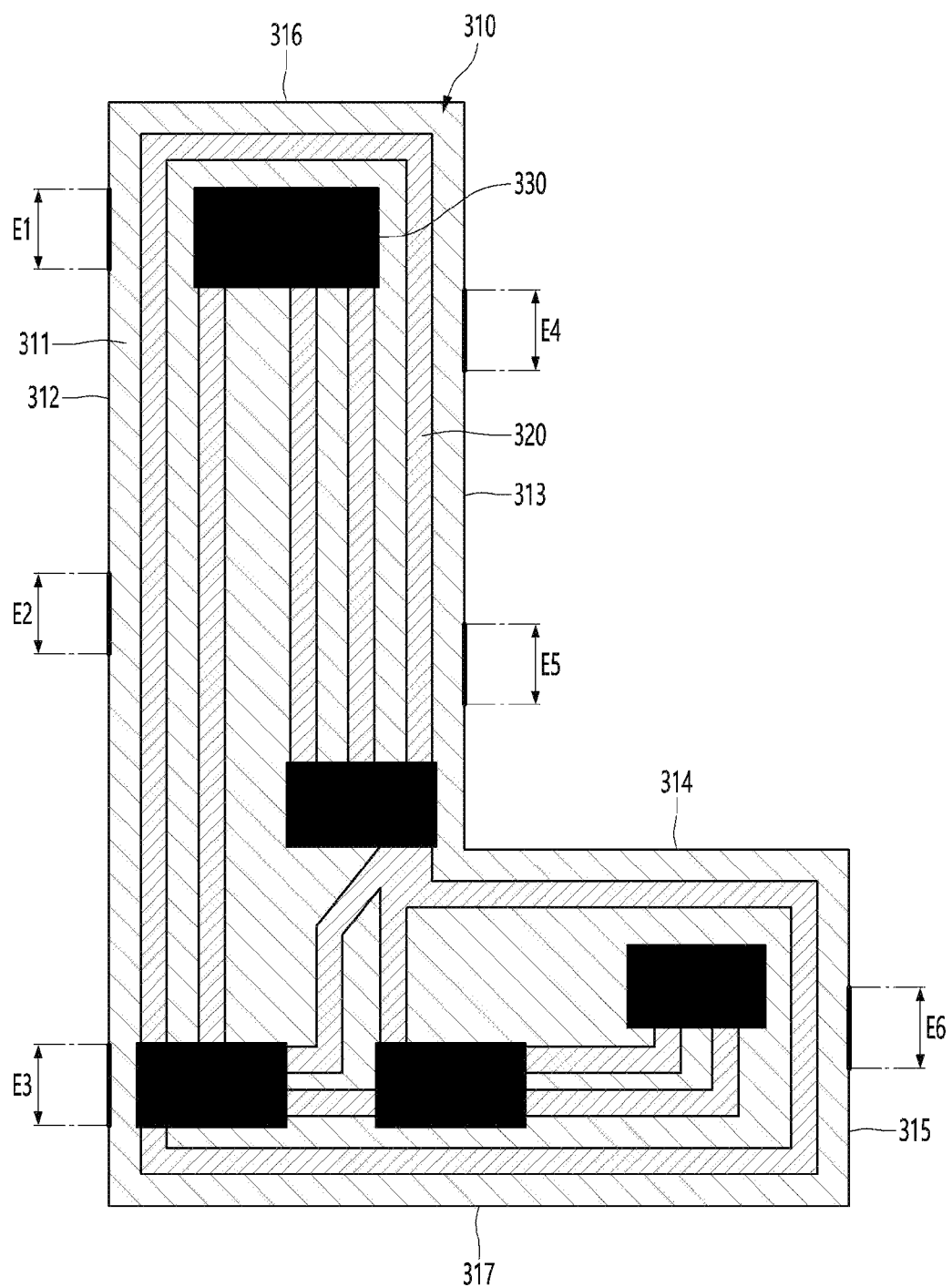
FIG. 8 is a plan view showing a second modified example of the substrate shown in FIG. 4.

FIG. 7 is a plan view showing a first modified example of the substrate shown in FIG. 4, and FIG. 8 is a plan view showing a second modified example of the substrate shown in FIG. 4.

The planar shape of the substrate in FIG. 4 was a square shape.

Alternatively, as shown in FIG. 7, the planar shape of the substrate 200 may have a circular shape. Preferably, the planar shape of the substrate 200 may be a circular shape having a constant curvature as a whole, and have a linear shape extending in a direction corresponding to the grain of the insulating layer in portions A1' and B1'. Substantially, the planar shape of the substrate 200 may have an elliptical shape in which the portions A1' and B1' are straight lines.

The substrate may include an insulating layer 210 and a circuit pattern 220 disposed on the insulating layer 210. In addition, although not shown in the drawing, at least one element may be disposed on the circuit pattern 220.

Meanwhile, the portion A1' and B1' extending in the same direction as a grain direction of the insulating layer 210 among the outer side surfaces of the insulating layer 210 has a second surface roughness as described above. In addition, portions other than the portions A1' and B1' have the first surface roughness as described above.

As shown in FIG. 7, the planar shape of the substrate in the first modified example has an elliptical shape, and thus the entire region A1' and B1' of the outer side surface extending in the same direction as the grain of the insulating layer may have the second surface roughness.

Alternatively, as shown in FIG. 8, the planar shape of the substrate 300 may have an L-shape.

The substrate may include an insulating layer 310 and a circuit pattern 220 disposed on the insulating layer 310. In addition, at least one device 330 may be disposed on the circuit pattern 320. In addition, although not shown in the drawing, a protective layer (not shown) may be disposed on the insulating layer 310.

Meanwhile, the insulating layer 310 may include an upper surface 311 and first to sixth outer side surfaces 312, 313, 314, 315, 316, and 317.

In this case, the first outer side surface 312, the second outer side surface 313, and the fourth outer side surface 314 may extend in a first direction corresponding to a grain direction of the insulating layer 310. In addition, the third outer side surface 314, the fifth outer side surface 315, and the sixth outer side surface 316 may extend in a second direction different from the grain direction of the insulating layer 310.

Accordingly, the first outer side surface 312, the second outer side surface 313, and the fourth outer side surface 314 may include portions having the second surface roughness as described above. That is, a first portion E1, a second portion E2, a third portion E3, a fourth portion E4, a fifth portion E5, and the sixth portion E6 in included in the first outer side surface 312, the second outer side surface 313, and the fourth outer side surface 314 may have a second surface roughness.

In addition, the remaining portion except for the first portion E1, the second portion E2, the third portion E3, the fourth portion E4, the fifth portion E5, and sixth portion E6 of the first outer side surface 312, the second outer side surface 313, and the fourth outer side surface 314 may have a first surface roughness different from the second surface roughness.

Hereinafter, a method of manufacturing a substrate according to an embodiment will be described.

FIGS. 9 to 17 are cross-sectional views showing a method of manufacturing a substrate according to an exemplary embodiment in the order of processes.

Figure 9:
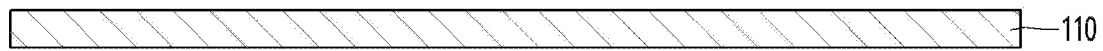
FIGS. 9 to 17 are cross-sectional views showing a method of manufacturing a substrate according to an exemplary embodiment in the order of processes.

First, referring to FIG. 9, the carrier frame 110 constituting the insulating layer 110 of the substrate 100 and serving as a basis for manufacturing the substrate is prepared. At this time, the insulating layer 110 is a part of the carrier frame, and accordingly, the insulating layer 110 and the carrier frame 110 are assigned the same reference numerals.

A grain may be formed in the carrier frame 110. Preferably, the carrier frame 110 may have a nematic structure. The nematic structure may mean a state in which all molecules have identical and constant directionality. Accordingly, the grain may be formed in the carrier frame 110 to correspond to the directionality of the molecules due to the nematic structure.

Preferably, the carrier frame 110 may be a polymer belonging to the category of P-hydroxy benzoic acid (benzoic acid with OH in the para-position) and monomer-based crystalline aromatic polyesters based on p-hydroxybenzoic acid and related monomers.

Preferably, the carrier frame 110 may include a polymer material such as vectron (a product obtained by melt spinning vectra) or Kevlar.

For example, the carrier frame 110 may be an anisotropic film of at least one of LCP (liquid crystal polymer) and HDPE (high density polyethylene), but is not limited thereto. In other words, as the carrier frame 110 has a nematic structure, it may be any one of various films including a polymer material in which molecules are arranged with one and the same directionality.

Accordingly, the carrier frame 110 may have a property of being cut along the grain by shear stress applied in the direction of the grain.

Figure 10:
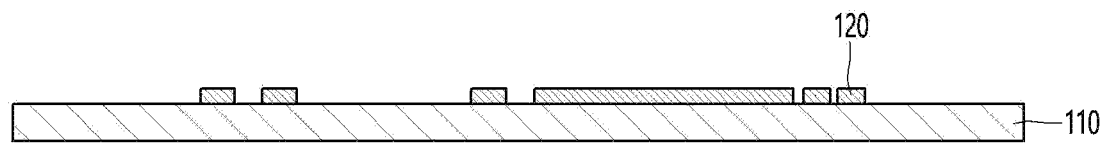

Next, as shown in FIG. 10, a circuit pattern 120 is formed on the carrier frame 110.

The circuit pattern 120 may be disposed on the carrier frame 110 to transmit an electrical signal. However, the embodiment is not limited thereto, and a layer corresponding to the circuit pattern 120 may be formed on the insulating layer 110, which may perform a heat dissipation function or a signal shielding function rather than an electrical signal transmission function.

The circuit pattern 120 may be formed of a metal material having high electrical conductivity. To this end, the circuit pattern 120 may be formed of at least one metal material selected from gold (Au), silver (Ag), platinum (Pt), titanium (Ti), tin (Sn), copper (Cu), and zinc (Zn). In addition, the circuit pattern 120 may be formed of a paste or solder paste including at least one metal material selected from gold (Au), silver (Ag), platinum (Pt), titanium (Ti), tin (Sn), copper (Cu), and zinc (Zn). Preferably, the circuit pattern 120 may be formed of copper (Cu), which has high electrical conductivity and is relatively inexpensive.

The circuit pattern 120 may be formed using an additive process, a subtractive process, a modified semi additive process (MSAP), and a semi additive process (SAP), which are typical printed circuit board manufacturing processes, and a detailed description will be omitted here.

Figure 11:
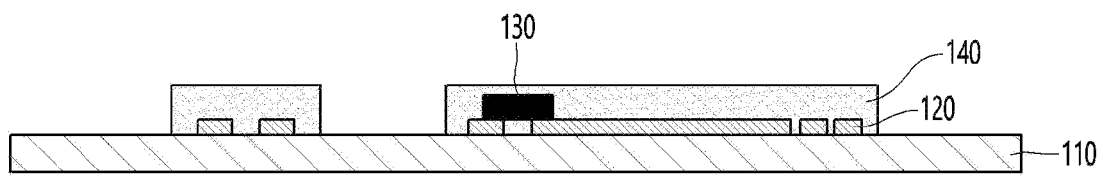

Next, as shown in FIG. 11, a device attachment process of attaching the device 130 on the circuit pattern 120 may be performed. The device 130 may be determined according to an application to which the substrate 100 is applied.

The device 130 may be a passive device. For example, the device 130 may be a passive device such as a wiring, a resistor, and a chip. The device 130 may be an active device. For example, the device 130 may be an active device such as a multiplexer, an application specific integrated circuit (ASIC), or a wireless communication module. In addition to this, the device 130 may include an optical device such as a lens or a waveguide, a magnetic device, and an electrochemical device such as a battery or an enzyme sensor.

When the device is attached, a protective layer 140 is formed on the carrier frame 110.

The protective layer 140 may be disposed on the carrier frame 110 to protect an exposed surface of the carrier frame 110 corresponding to a substrate region, the circuit pattern 120, and the device 130. Accordingly, the protective layer 140 may have a height greater than that of the device 130, and thus the circuit pattern 120 and the device 130 may be embedded in the protective layer 140, but is not limited thereto.

To this end, the protective layer 140 may include an epoxy acrylate-based resin. For example, the protective layer 140 may include a resin, a curing agent, a photo initiator, a pigment, a solvent, a filler, an additive, an acryl-based monomer, and the like. However, the embodiment is not limited thereto, the protective layer 140 may be any one of a solder-resist (SR), a cover-lay, and a polymer material.

Figure 12:
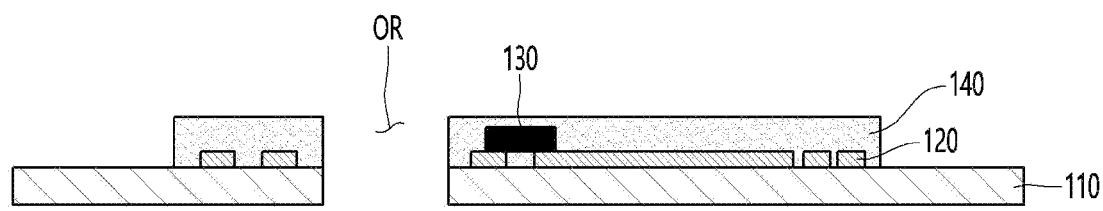

Next, as shown in FIG. 12, an open region OR passing through the upper and lower surfaces of the carrier frame 110 is formed.

The upper surface may be selectively formed according to an application to which the substrate is applied, and a shape thereof may also be selectively changed.

Figure 13:
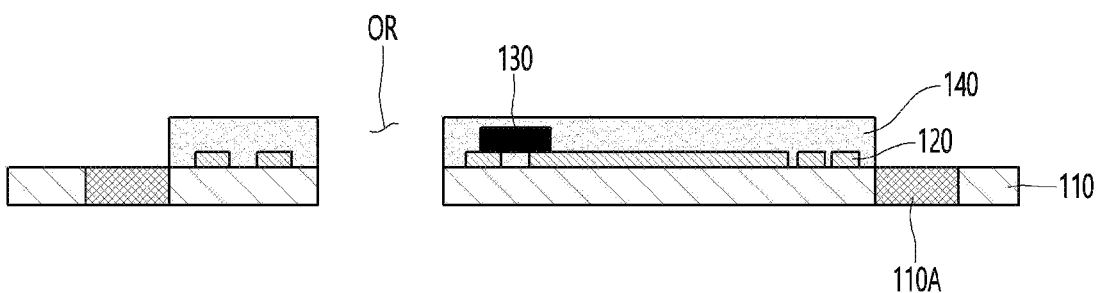

Next, as shown in FIG. 13, a process of classifying the substrate formed on the upper surface of the carrier frame 110 for each cell may be performed.

Figure 14:
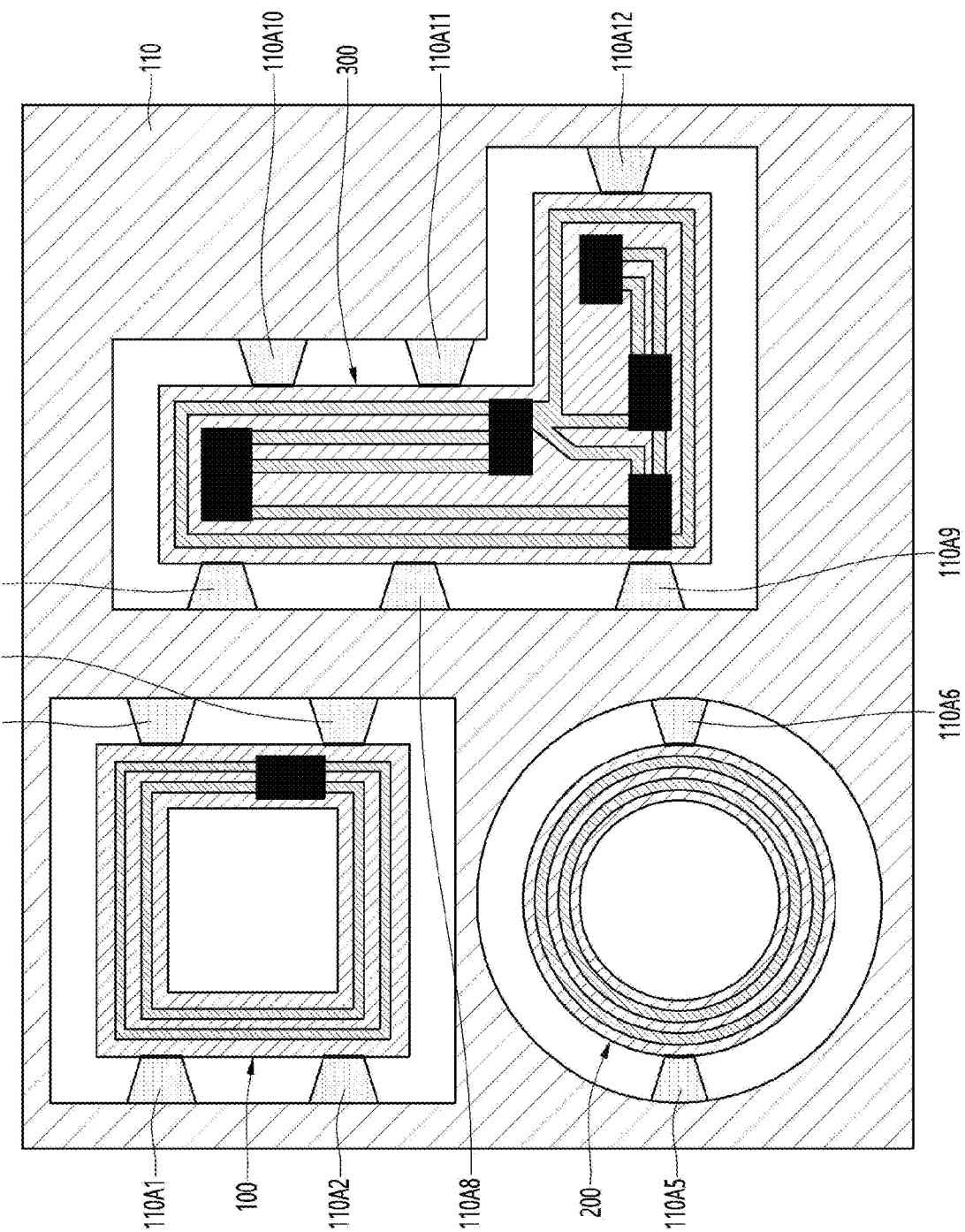

That is, as shown in FIG. 14, not only a substrate corresponding to one cell is manufactured on one carrier frame 110, but a plurality of substrates corresponding to a plurality of different cells may be simultaneously manufactured.

Accordingly, a process of classifying each substrate corresponding to each cell may be performed by laser processing an outer region of each cell.

In this case, in the embodiment, the laser processing may be performed only on the remaining regions except for some regions, rather than the entire outer region of each cell.

For example, in the embodiment, an anchor 100A capable of supporting each cell is formed on the carrier frame 110 by removing a part of the outer region of each cell. The anchor 100A is a part of the carrier frame 110. In this case, the anchor 100A may have a shape in which the width gradually increases from one end to the other end. For example, the anchor 100A may have a trapezoidal shape. In this case, the anchor 100A includes the other end opposite to the one end in contact with the outside of each of the substrate portions, and the width may gradually increase from one end to the other end.

At this time, the carrier frame 110 may include a first substrate portion 100 corresponding to the first cell, a second substrate portion 200 corresponding to the second cell, and a third substrate portion 300 corresponding to the third cell.

And, the anchor 100A in an embodiment may be formed in the outer regions of the first substrate portion 100, the second substrate portion 200, and the third substrate portion 300 by proceeding with the process of removing the remaining portions except for the anchor 100A.

Preferably, a first anchor 110A1, a second anchor 110A2, a third anchor 110A3, and a fourth anchor 110A4 may be formed on the outside of the first substrate portion 100. In addition, a fifth anchor 110A5 and a sixth anchor 110A6 may be formed on the outside of the second substrate portion 200. In addition, the seventh anchor 110A7, the eighth anchor 110A8, the ninth anchor 110A9, the tenth anchor 110A10, the eleventh anchor 110A11, the twelfth anchor 110A12 may be formed on the outside of the third substrate portion 300

In this case, the first to twelfth anchors 110A1 to 110A12 may be disposed in an outer region corresponding to a grain direction of the carrier frame 110 among the outer regions of each substrate portion. In other words, the outer region of the substrate portion may include a first region extending in the same direction as a grain direction of the carrier frame 110 and a second region excluding the first region. In addition, the first to twelfth anchors 110A1 to 110A12 may be formed only in the first region except for the second region. In addition, the first to twelfth anchors 110A1 to 110A12 may be formed on the entire portion of the first region, and differently, may be formed only on a partial region of the first region.

Figure 15:
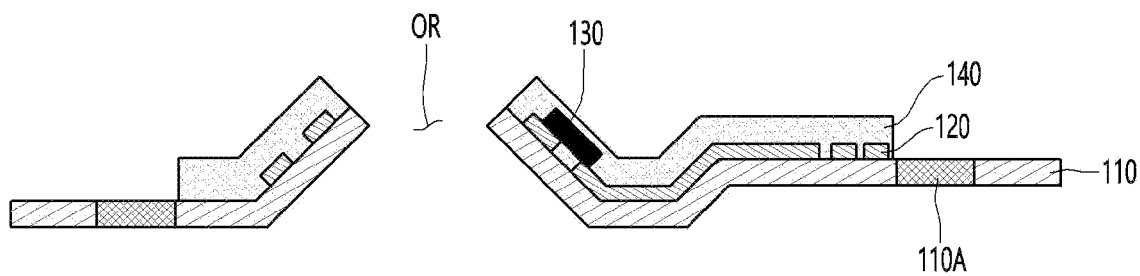
Figure 16:
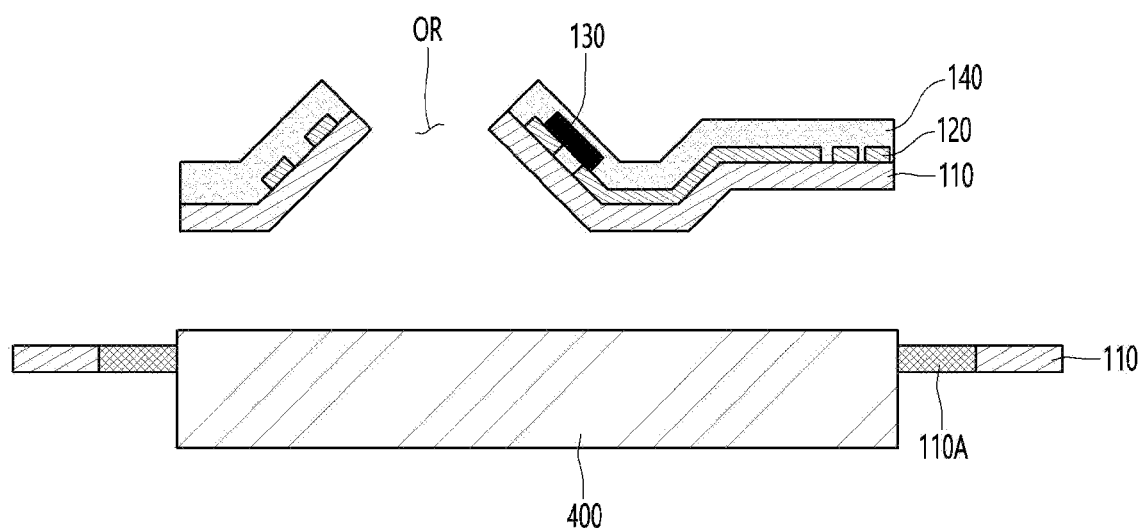

Next, as shown in FIG. 15, each substrate portion is thermoformed to have a three-dimensional shape corresponding to the application in a state in which the first to twelfth anchors 110A1 to 110A12 are formed Next, as shown in FIG. 16, shear stress is applied to the anchors of each of the substrates using a jig 400 to separate each of the substrates from the carrier frame 110.

Figure 17:
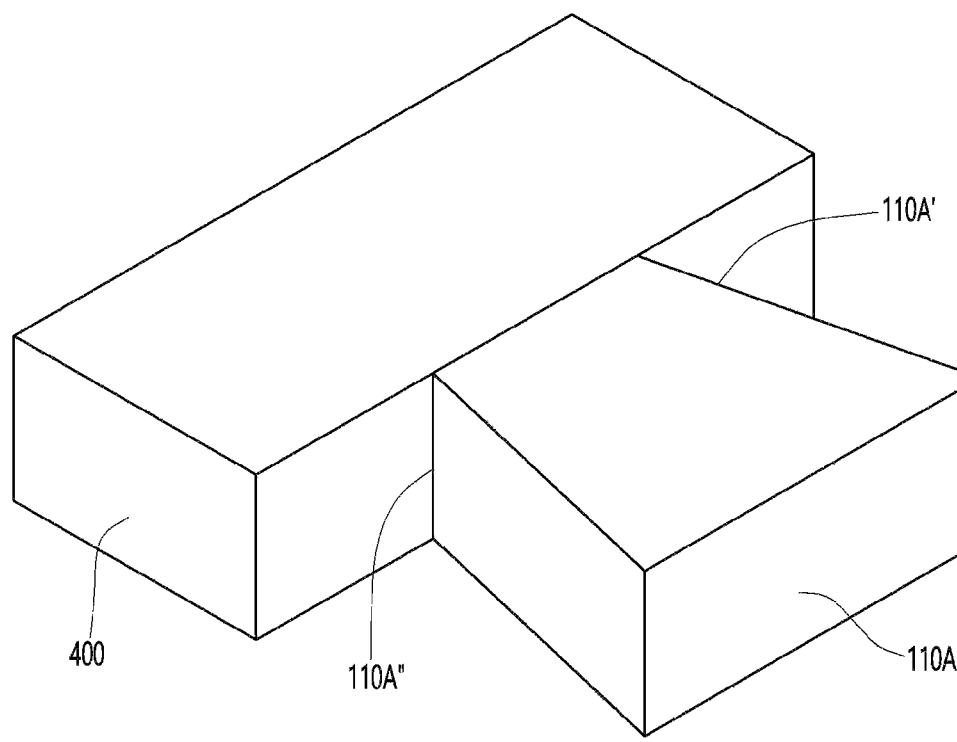
Figure 17:
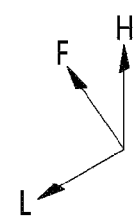

At this time, as shown in FIG. 17, the jig 400 does not apply a constant shear stress in the height direction (H) with an angle of 90 degrees from the bottom of the anchor, but rises diagonally in the height direction to apply a shear stress (F). Each of the anchors 100A includes one end 110A' and the other end 110A". And, the jig 400 does not apply a shear stress to the entire region of the lower surface of the anchor 100A at the same time, and preferentially contacts the one end 110A' to preferentially the shear stress (F) to the one end 110A', and accordingly, it is possible to sequentially provide the shear stress in the direction of the other end 110A".

Each of the substrate portions manufactured in this way may include an outer side surface. The outer side surface means a side surface positioned on the outside of the substrate 100, and for example, the substrate 100 may include an outer side surface of the insulating layer 110 and an outer side surface of the protective layer 140. In this case, an entire region of the outer side surface of the protective layer 140 may have a uniform surface roughness. Here, the insulating layer 110 is a part of the carrier frame 110, and may mean a partial region constituting each substrate portion among the entire region of the carrier frame 110.

Meanwhile, the outer side surface of the insulating layer 110 may include a region having a first surface roughness and a region having a second surface roughness having a second roughness different from the first roughness, based on a grain direction of the insulating layer 110. In this case, the portion having the first surface roughness is a portion removed by the laser processing, and the portion having the second surface roughness is the portion in which the anchor was positioned.

According to an embodiment, a substrate is manufactured using a carrier frame with one constant directionality in an entire region, and the carrier frame is laser machined to form an anchor around the substrate. In this case, the anchor may be formed to separate only the region in which the manufactured substrate is formed on the carrier frame. At this time, a side surface of the anchor is in contact with an outer side surface of the substrate. Then, when a 3D molding process of the substrate is completed, an interface between the anchor and the outer side surface of the substrate is cut to separate the substrate.

Here, in the present embodiment, the side surface of the anchor connected to the outer side surface of the substrate extends in a first direction. In this case, the first direction corresponding to the extension direction of the side surface of the anchor may correspond to the directionality of the carrier frame. That is, the carrier frame is a polymer having a nematic structure in which molecules are arranged in a certain specific direction, and accordingly, a grain is formed in the carrier frame to correspond to the direction in which the molecules are arranged. Accordingly, when forming the anchor, the remaining portions of the outer side surface of the substrate except for a portion having the same extension direction as the direction of the carrier frame are laser processed, and accordingly, the anchor is formed only on the outer side surface of the substrate having the same extension direction as the direction of the carrier frame. Accordingly, in an embodiment, the substrate may be easily separated by providing a shear stress to the interface without performing an alignment process for separating the substrate or an additional laser or cutting process.

In addition, in an embodiment, module products can be separated using the anchor after forming a plurality of module products requiring three-dimensional molding on a carrier frame, and accordingly, it is suitable for mass production of 3D molding, and molding difficulty may be reduced by reducing residual stress that may be generated due to the carrier frame.

Features, structures, effects, etc. described in the above embodiments are included in at least one embodiment, and it is not necessarily limited to only one embodiment. Furthermore, features, structures, effects, etc. illustrated in each embodiment can be combined or modified for other embodiments by those of ordinary skill in the art to which the embodiments belong. Accordingly, the contents related to such combinations and variations should be interpreted as being included in the scope of the embodiments.

In the above, the embodiment has been mainly described, but this is only an example and does not limit the embodiment, and those of ordinary skill in the art to which the embodiment pertains will appreciate that various modifications and applications not illustrated above are possible without departing from the essential characteristics of the present embodiment. For example, each component specifically shown in the embodiment can be implemented by modification. And the differences related to these modifications and applications should be interpreted as being included in the scope of the embodiments set forth in the appended claims.

I claim:

1. A substrate comprising:
   a first insulating layer; and
   a circuit pattern disposed on the first insulating layer;
   wherein the insulating layer includes an upper surface and an outer side surface extending from the upper surface and disposed along a circumferential direction of the upper surface,
   wherein the outer side surface of the first insulating layer includes:
   a first outer side surface disposed in a first horizontal direction; and a second outer side surface disposed in a second horizontal direction different from the first horizontal direction, wherein at least a part of the first outer side surface has a first surface roughness; and wherein the second outer side surface has a second surface roughness different from the first surface roughness.

2. The substrate of claim 1, wherein a circumference of the upper surface of the first insulating layer includes:

a first portion of a straight line disposed in the first horizontal direction; and a second portion of a straight line connected to the first portion and disposed in the second horizontal direction, wherein the first outer side surface is connected to the first portion of the upper surface, and wherein the second outer side surface is connected to the second portion of the upper surface.

3. The substrate of claim 1, wherein a circumference of the upper surface of the first insulating layer includes a curve, wherein the curve includes a first portion disposed in the first horizontal direction; and a second portion disposed in the second horizontal direction other than the first horizontal direction, wherein the first outer side surface is connected to the first portion of the upper surface, and wherein the second outer side surface is connected to the second portion of the upper surface.

4. The substrate of claim 1, wherein the first insulating layer includes a polymer material having a grain disposed in a direction corresponding to the first horizontal direction.

5. The substrate of claim 4, wherein the first insulating layer includes a polymer having a nematic structure.

6. The substrate of claim 4, wherein the first insulating layer includes LCP (Liquid crystal polymer) or HDPE (High density polyethylene).

7. The substrate of claim 4, wherein the grain of the polymeric material is exposed through the first and second outer side surfaces of the insulating layer.

8. The substrate of claim 7, wherein a shape of the grain of the polymeric material exposed through the first outer side surface is different from a shape of the grain of the polymeric material exposed through the second outer side surface.

9. The substrate of claim 7, wherein a direction of the grain of the polymer material exposed through the first outer side surface is different from a direction of the grain of the polymer material exposed through the second outer side surface.

10. The substrate of claim 1, wherein the first outer side surface is divided into a first outer side portion and a second outer side portion along the circumferential direction, wherein the first outer side portion has the first surface roughness; and wherein the second outer side portion has the second surface roughness corresponding to the second outer side surface.

11. The substrate of claim 10, wherein the second outer side portion is disposed closer to the second outer side surface than the first outer side portion.

12. The substrate of claim 1, wherein the first insulating layer includes carbon provided on the second outer side surface.

13. The substrate of claim 1, further comprising:

at least one device disposed on the circuit pattern.

14. The substrate of claim 1, further comprising: a second insulating layer disposed on the first insulating layer and covering a surface of the first insulating layer and a surface of the circuit pattern.

15. The substrate of claim 1, wherein the insulating layer includes a flat region and a bending region bent in a vertical direction from the flat region.

16. The substrate of claim 15, wherein the bending region includes:

a first bending region bent with a first inclination in the vertical direction from one end of the flat region; and a second bending region bent with a second inclination different from the first inclination in the vertical direction from the other end of the flat region.

17. The substrate of claim 15, wherein the flat region of the first insulating layer includes:

a first flat region having a first height; and a second flat region having a second height different from the first height and having a step difference from the first flat region.

* * * * *